United States Patent
Origlia

(10) Patent No.: US 7,085,138 B2
(45) Date of Patent: Aug. 1, 2006

(54) ELECTRONIC CONTROL UNIT, IN PARTICULAR A SPEED CONTROL UNIT FOR AN ELECTRIC FAN, AND A PROCESS FOR ITS FABRICATION

(75) Inventor: Aulo Origlia, Asti (IT)

(73) Assignee: Gate S.r.l, Turin (IT)

( * ) Notice: Subject to any disclaimer, the term of this patent is extended or adjusted under 35 U.S.C. 154(b) by 16 days.

(21) Appl. No.: 10/950,487

(22) Filed: Sep. 28, 2004

(65) Prior Publication Data

US 2005/0068750 A1 Mar. 31, 2005

(30) Foreign Application Priority Data

Sep. 29, 2003 (IT) .......................... TO2003A0754

(51) Int. Cl.
*H05K 5/06* (2006.01)
(52) U.S. Cl. ..................................... 361/752; 439/76.2
(58) Field of Classification Search ............... 174/52.1; 361/752; 439/76.2
See application file for complete search history.

(56) References Cited

U.S. PATENT DOCUMENTS

| 6,461,171 B1 * | 10/2002 | Kanaoka et al. ............ 439/76.2 |
| 6,773,271 B1 * | 8/2004 | Falchetti ..................... 439/76.2 |
| 6,848,916 B1 * | 2/2005 | Nakayama et al. ......... 439/76.2 |
| 6,870,097 B1 * | 3/2005 | Oda ............................. 174/50 |
| 6,916,184 B1 * | 7/2005 | Yamada ...................... 439/76.2 |
| 6,926,541 B1 * | 8/2005 | Takeuchi et al. ........... 439/76.2 |
| 2002/0126466 A1 * | 9/2002 | Suzuki et al. ................ 361/818 |

* cited by examiner

*Primary Examiner*—Hung V. Ngo
(74) *Attorney, Agent, or Firm*—Sughrue Mion, PLLC

(57) ABSTRACT

The control unit comprises a printed circuit board on which is mounted a plurality of components such as MOSFET transistors, in particular components of the so-called SMD type; and a support of plastics material, including a frame which has two opposite perimetral edges and from which extends at least one external integral formation in the form of an electric connector element in which are provided electrically conductive connector terminals which have respective ends which extend partly into the frame in a direction essentially orthogonal to the general plane of the frame, towards the first perimetral edge of this latter. The frame further has a support structure which extends into the frame between the two said perimetral edges; first integral retainer formations operable to hold the printed circuit board to the frame on a first side with respect to the support structure close to the first perimetral edge of the frame; and second integral retainer formations which extend from the support structure and are directed away from the first perimetral edge, that is towards the second perimetral edge of the frame and which retains at least one independent electronic component provided with wire rheofores, such as a capacitor, on the other side of the support structure. The rheofores of this independent component and the ends of the terminals extend towards, through and beyond the said printed circuit board and are soldered to it on its face opposite the support structure.

10 Claims, 8 Drawing Sheets

US 7,085,138 B2

ELECTRONIC CONTROL UNIT, IN PARTICULAR A SPEED CONTROL UNIT FOR AN ELECTRIC FAN, AND A PROCESS FOR ITS FABRICATION

BACKGROUND OF THE INVENTION

The present invention relates to an electronic control unit and a process for its production.

More specifically, the invention relates to an electronic control unit, in particular a unit for adjusting the speed of an electric fan, comprising a plurality of electrical/electronic components preliminarily mounted on a printed circuit board, in particular components of the so-called surface mount or SMD type as well as least one or more electronic components in the form of wire rheophores such as, for example, capacitors.

SUMMARY OF THE INVENTION

One object of the present invention is to provide an electronic control unit of this type, which can be made in a simple and economic manner, and which has a high reliability in use.

This, and other objects are achieved according to the invention with an electronic control unit.

As indicated above, the invention further relates to a process for the fabrication of such an electronic control unit.

BRIEF DESCRIPTION OF THE DRAWINGS

Further characteristics and advantages of the invention will become apparent from the following detailed description given purely by way of non-limitative example, with reference to the attached drawings, in which.

DETAILED DESCRIPTION OF THE INVENTION

Figure 1:
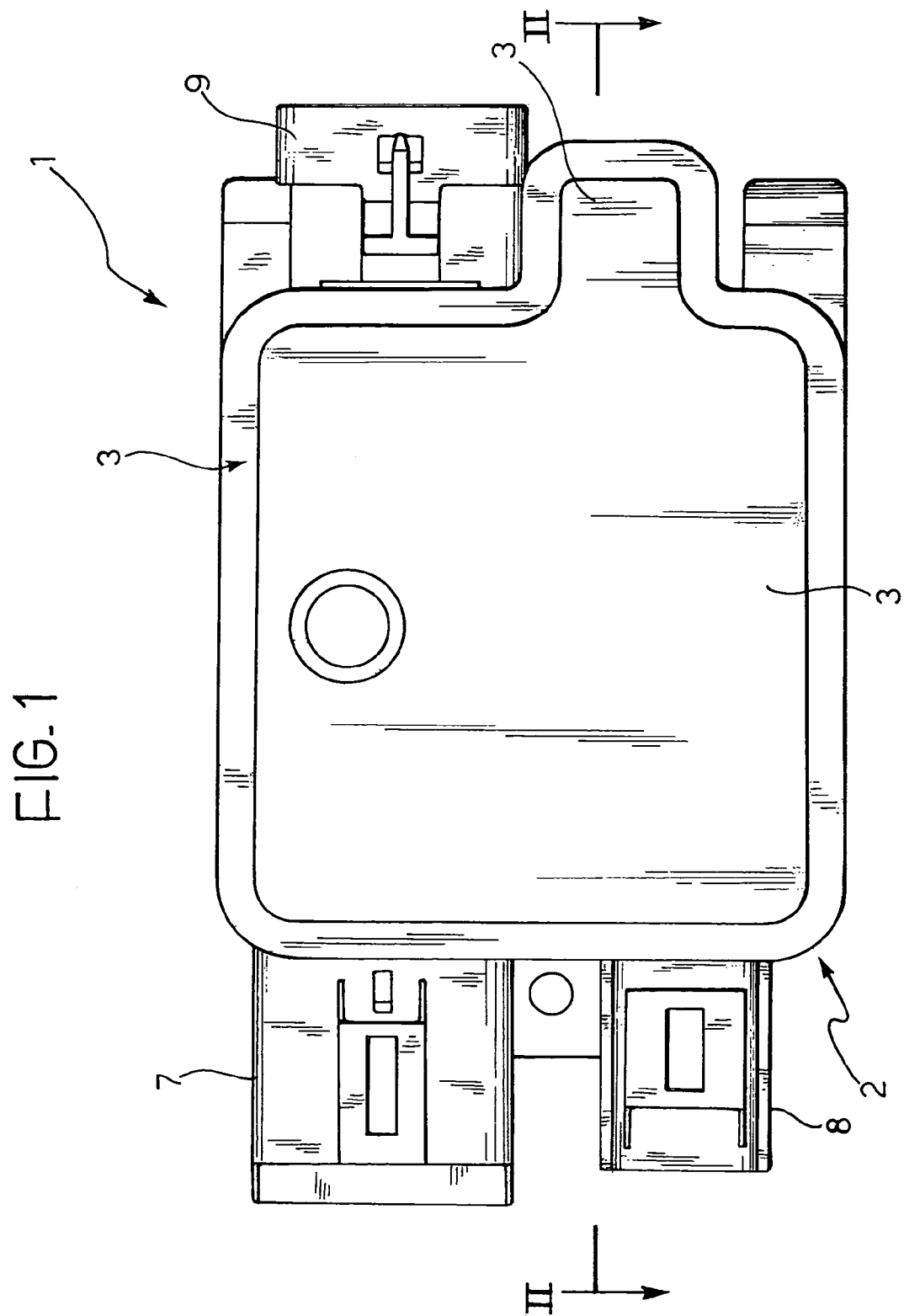
FIG. 1 is a plan view from above of an electronic control unit according to the present invention, shown in the assembled condition.

In the drawings, and in particular in Figures from 1 to 3, an electronic control unit, according to the invention is generally indicated 1. In the exemplary embodiment illustrated, the control unit 1 is a speed control unit for an electric fan. The invention is obviously not limited to this application. The unit 1 includes a casing generally indicated 2. In the embodiment illustrated this casing essentially comprises an upper cover 3 of plastics material, for example PBT (polybutylene terephthalate), an intermediate support 4, likewise of plastics material, for example PBT, and a heat dissipator element 5 of metal, for example aluminium or its alloys, serving at the same time as a lower cover.

As is seen in particular in FIGS. from 3 to 6, the intermediate support 4 comprises a frame 6 of essentially rectangular form from which extend three external integral formations 7, 8 and 9 in the form of electrical connector elements. Within each of these formations 7, 8 and 9, lie respective electrically conductive connector terminals indicated 10, 11 in FIG. 3 and 12 in FIG. 7.

Figure 8:
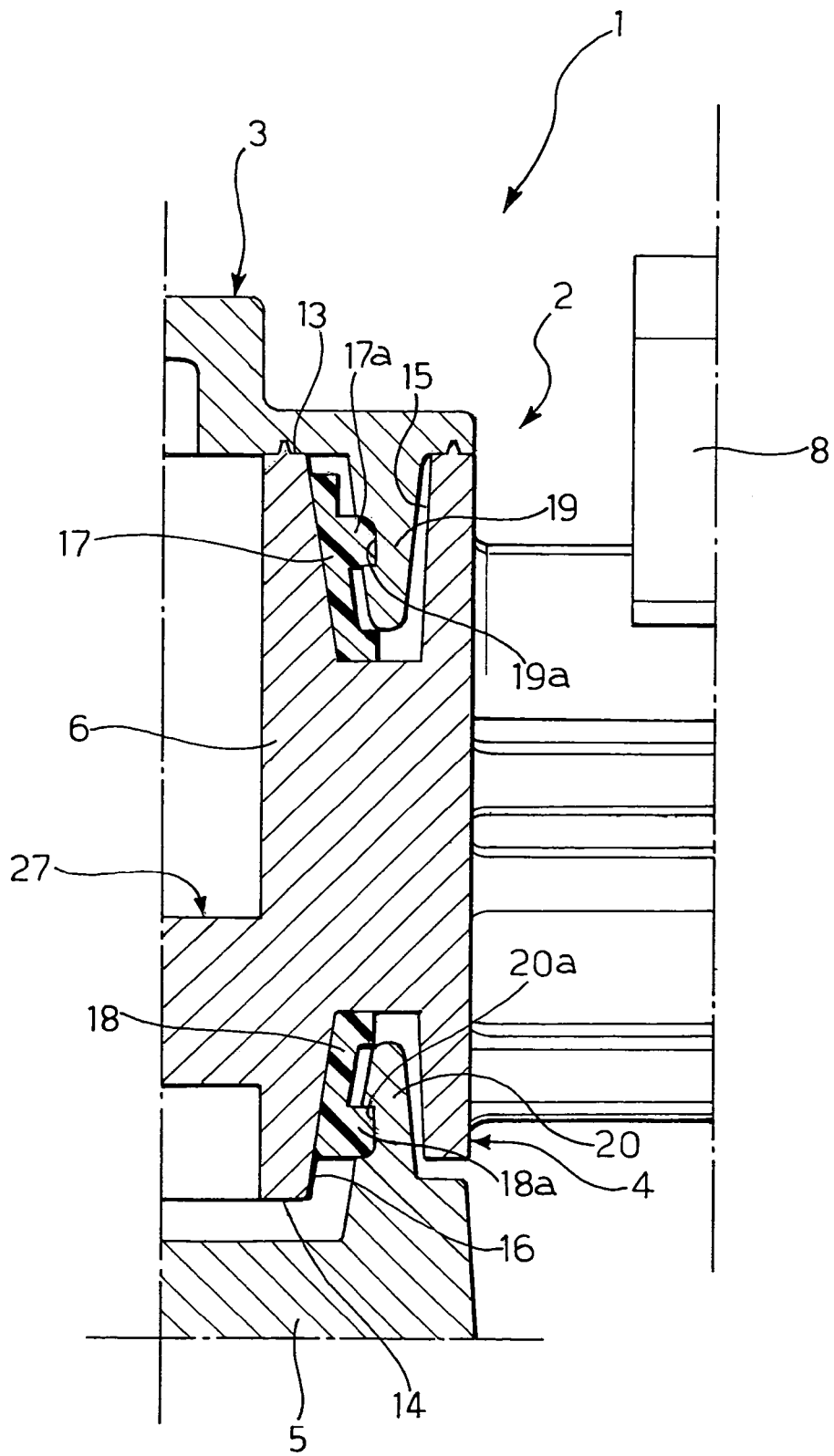
FIG. 8 is a sectioned view which shows, on an enlarged scale, a detail indicated VIII in FIG. 2.

The frame 6 of the support 4 has two opposite perimetral edges 13 and 14 (FIG. 3) upper and lower respectively, in which are formed respective recesses or grooves indicated 15 and 16 in FIG. 8. In these recesses 15 and 16 are conveniently disposed respective seals 17 and 18, formed for example of a mouldable elastomeric material such as that known under the commercial name "Santoprene", produced by Monsanto. In the embodiment illustrated in FIG. 8 the seal 17 associated with the recess 15 of the upper perimetral edge 13 has an essentially "t" shape cross section with an intermediate transverse arm 17a which engages in a corresponding recess 19a in a projecting edge 19 which juts out from the lower face of the cover 3.

Similarly, the seal 18 associated with the recess 16 in the lower perimetral edge 14 of the frame 6 has an essentially "C" shape cross section with a lower transverse limb 18a which engages in a corresponding recess formed in the inner face of a perimetral projection 20 jutting out from the upper face of the heat dissipator element 5.

The cover 3 can conveniently be formed by injection moulding.

The intermediate frame 4, partially described above, can also be conveniently formed by injection moulding. The associated seals 17 and 18 described above with particular reference to FIG. 8 can conveniently be overmoulded on the intermediate frame 4.

As an alternative to this arrangement, within the recesses 15 and 16 of the opposite perimetral edges 13 and 14 of the frame 6 of the intermediate support may be deposited beads of fluid resin, for example of a silicone resin or an epoxy resin, in which the projecting edges 19 and 20 of the cover 3 and of the heat dissipator 5 respectively are immersed upon assembly of the control unit.

The electronic unit 1 includes a printed circuit board 21 (see for example FIGS. 2, 3, 6, and 7) on to which is mounted a plurality of electrical and/or electronic components, in particular of the so-called SMD type. With reference to FIG. 3, in the example embodiment illustrated, the plate 21 carries in particular four transistors M1–M4 of MOSFET type fixed along its side 21a.

Figure 5:
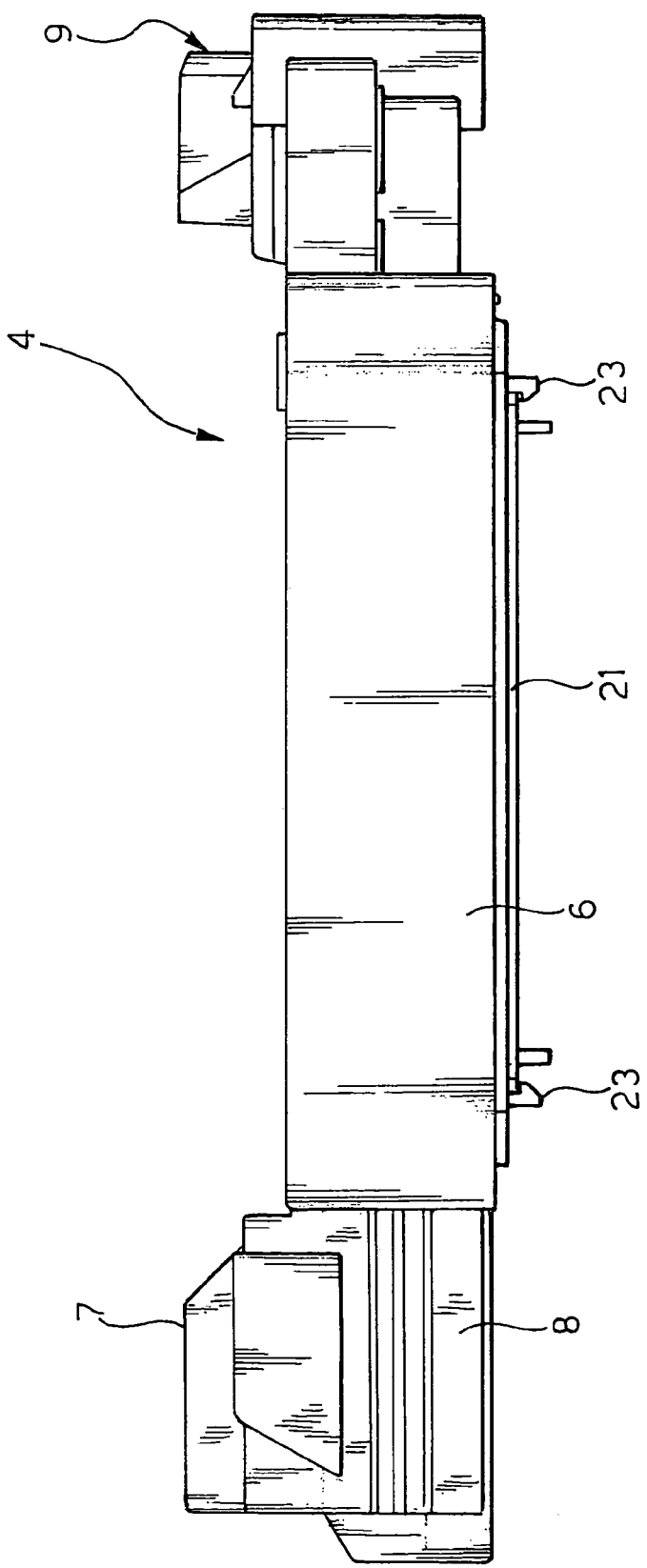
FIG. 5 is a side view in the direction of the arrow V of FIG. 4 of the frame illustrated there.
Figure 6:
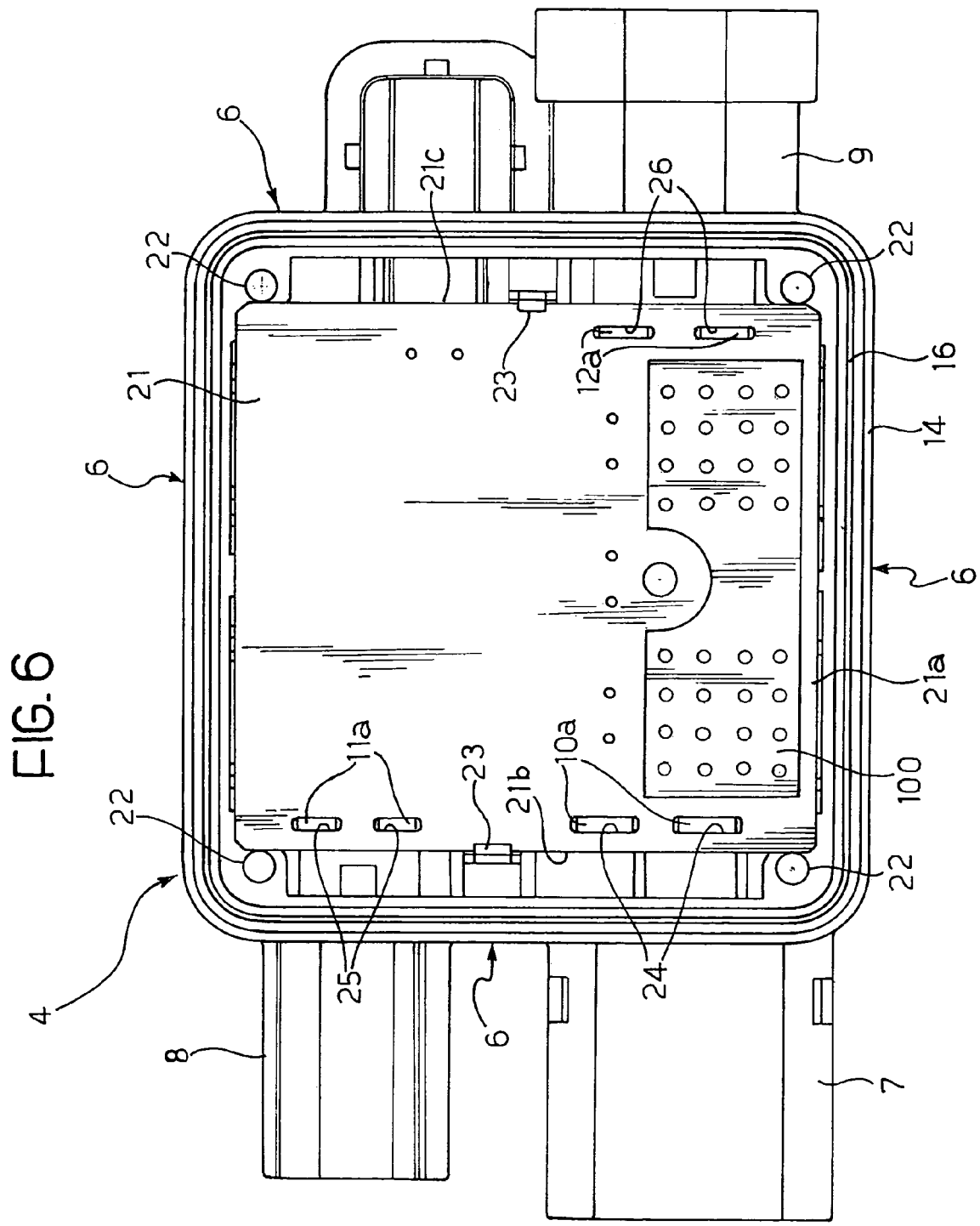
FIG. 6 is a plan view from below of the frame of FIGS. 4 and 5, after coupling a printed circuit board to it.

With reference in particular to FIGS. 3 and 5 to 7, the printed circuit board 21 is located at its corners against corresponding inner stop projections 22 integral with the frame 6 of the intermediate support 4. The printed circuit board 21 is fixed to the support 4 close to the lower perimetral edge 14 of the frame 6 by its snap engagement between spring retainer projections 23 (FIGS. 5 and 6) capable of engaging two opposite sides indicated 21b and 21c respectively (FIG. 6).

The previously-described connector terminals 10, 11 and 12 have respective ends 10a, 11a, 12a (FIGS. 4, 6, and 7) which extend into the interior of the frame 6 of the intermediate support in a direction essentially orthogonal to the general plane of this frame, towards the lower perimetral edge 14 of this latter. These ends of the connector terminals extend through and beyond corresponding slot-like openings 24, 25 and 26 (FIGS. 3, 6 and 7) arranged in the printed circuit board 21 and soldered to this plate for example by means of wave soldering on the face opposite the intermediate support 4.

Figure 7:
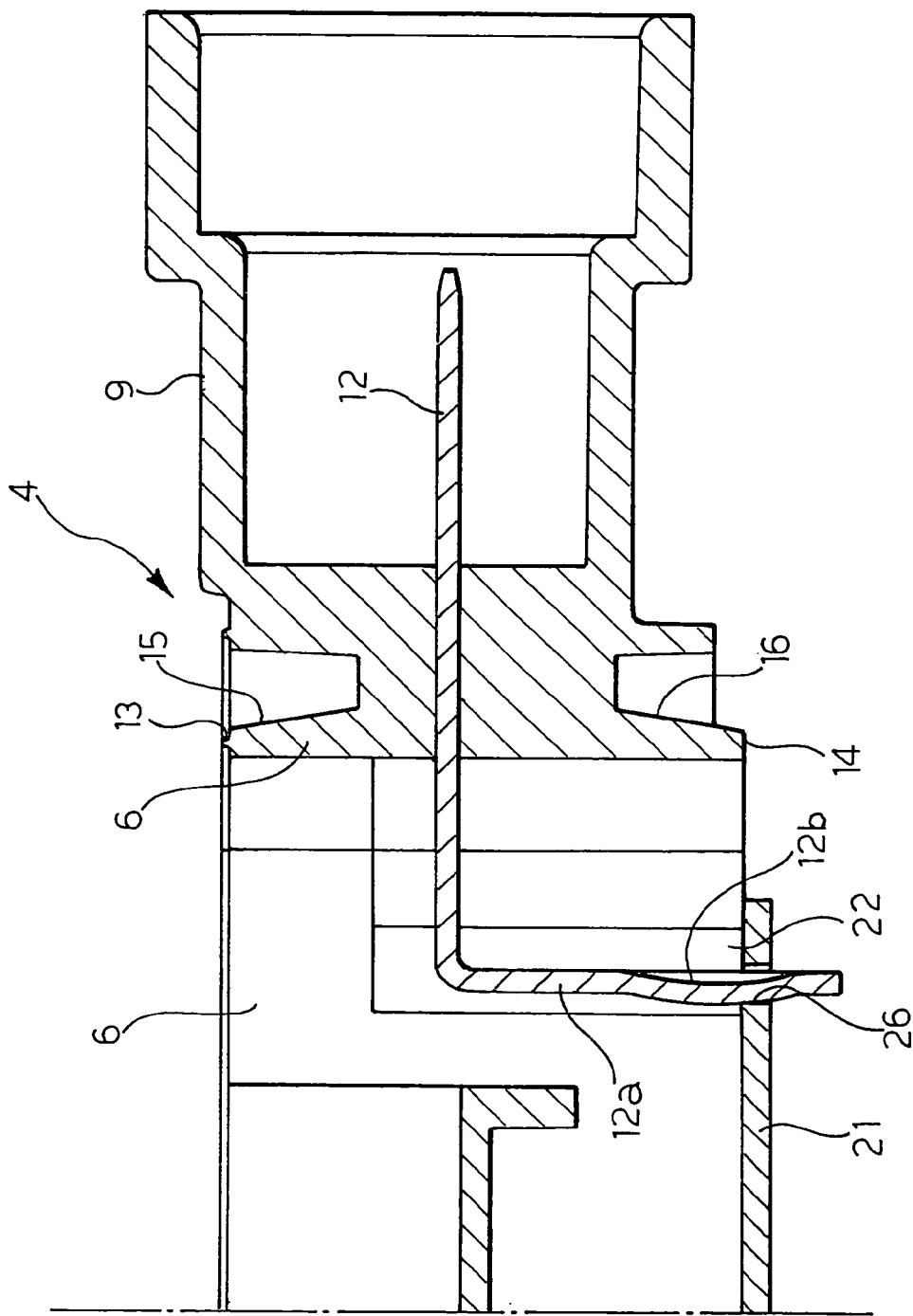
FIG. 7 is a view on an enlarged scale, sectioned on the line VII—VII of FIG. 4.

Conveniently, the ends 10a–12a of the connector terminals 10–12 which pass through the corresponding apertures 24–26 in the printed circuit board 21 have respective so called half sheared or struck parts such as that indicated 12b in FIG. 7 which increase one dimension of its transverse section in the region inserted into the corresponding slot 26 of the plate 21. This arrangement makes it possible to reduce the contact resistance in the soldered zone, and allows an easier insertion of the end of the terminal into the associated slot of the board 21 without making it necessary to over-dimension this slot for the purpose of compensating the effects of differential shrinkage of the plastics material during or after moulding, and the inevitable constructional tolerances.

Within the frame 6 the intermediate support 4 has a support structure 27 essentially of reticular form between the two perimetral edges 13 and 14 of the said frame (FIGS. from 2 to 4).

In the exemplary embodiment illustrated the control unit 1 comprises four independent electronic components provided with wire rheofores in particular capacitors. In FIG. 3 one of these capacitors is indicated C1, whilst in FIG. 4 these components are indicated C1–C4.

Figure 2:
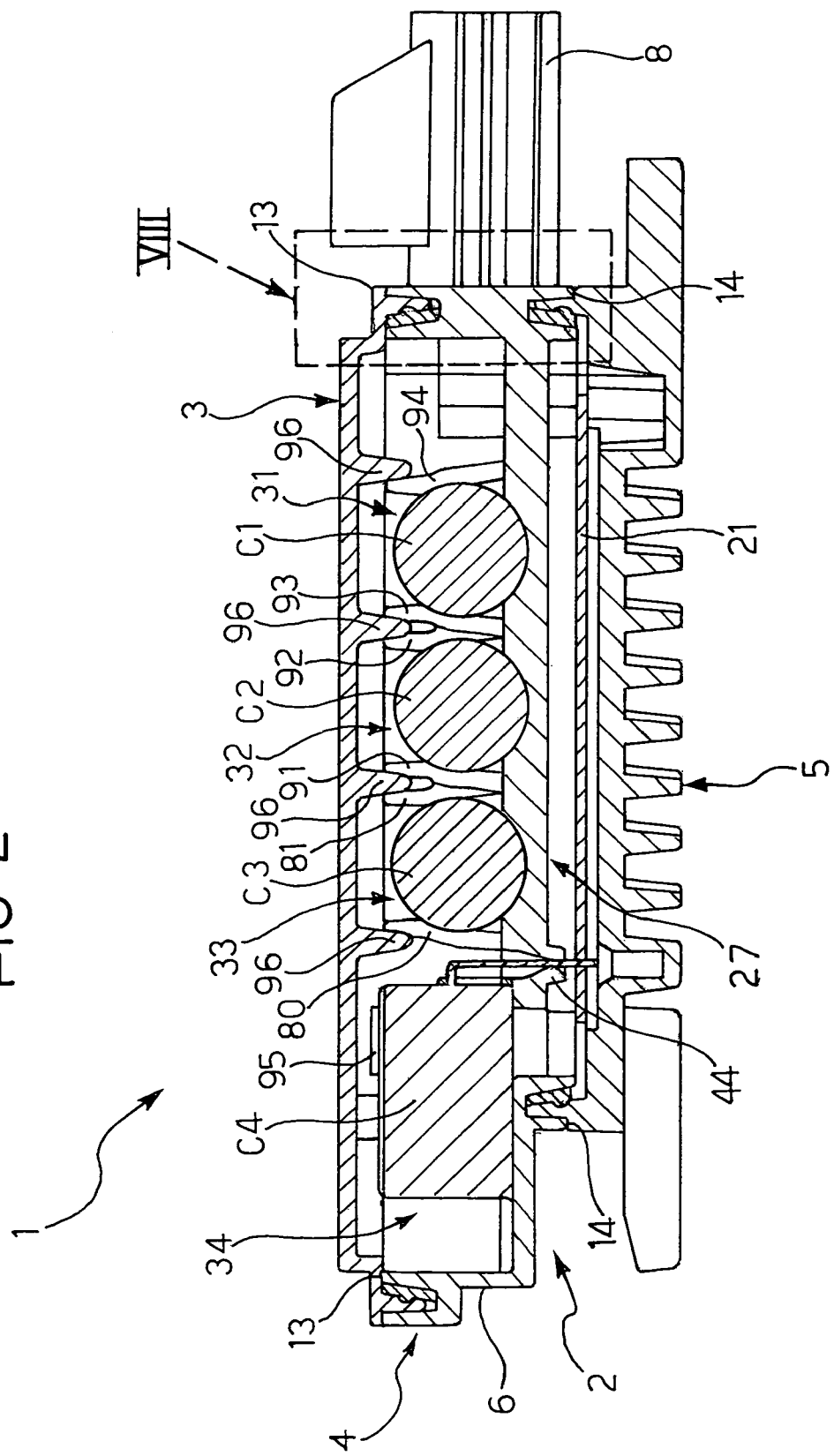
FIG. 2 is a view in section taken on the line II-II of FIG. 1.
Figure 3:
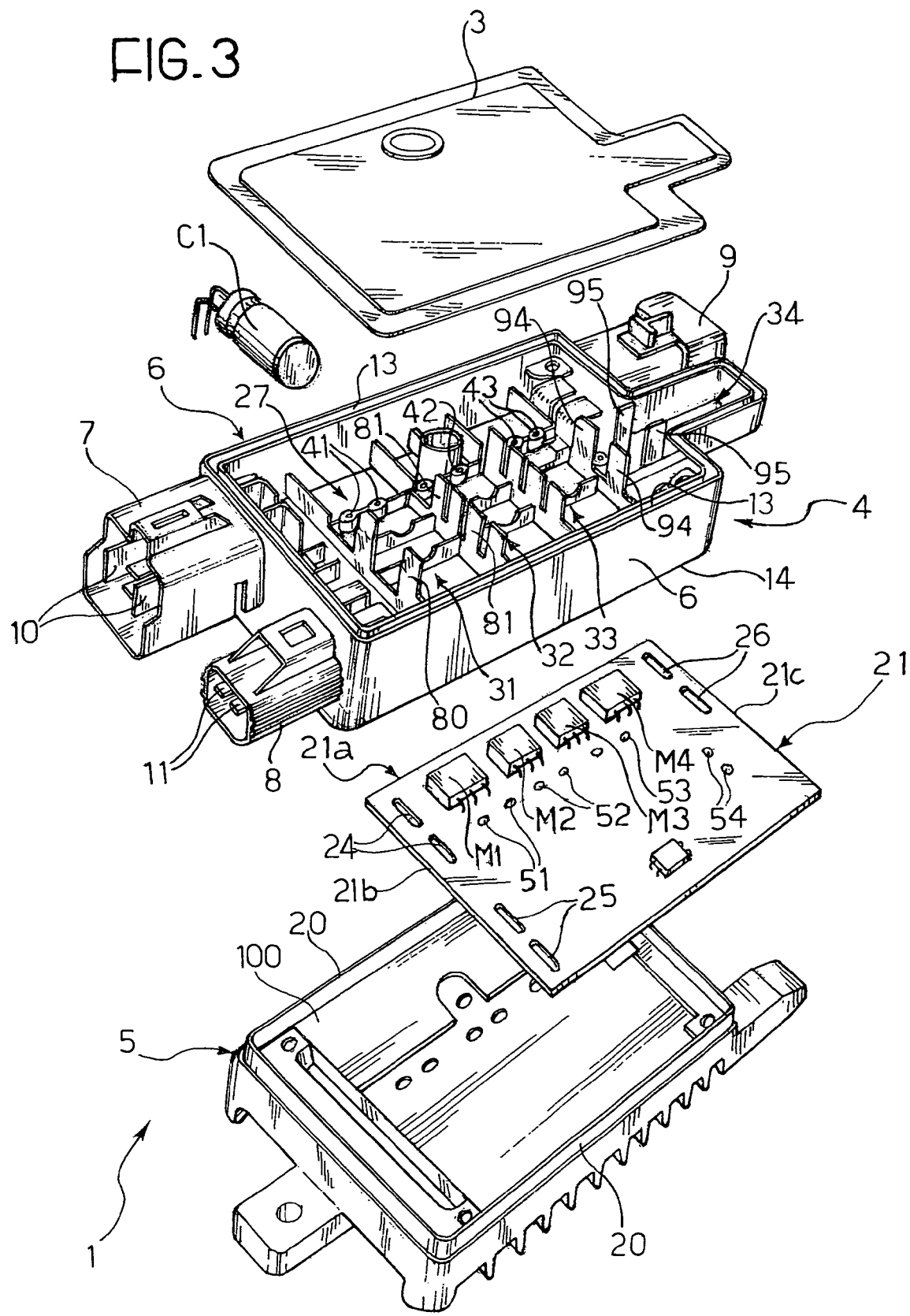
FIG. 3 is an exploded perspective view of the control unit of the preceding Figures.

The support structure 27 within the frame 6 defines three adjacent parallel housing zones indicated 31, 32 and 33 in FIGS. 2 and 3, in which the components C1, C2 and C3 are disposed, with their axes lying essentially horizontal. In the illustrated embodiment the component C4 is lodged in the niche 34 protruding outwardly from one side of the frame 6 (FIGS. from 2 to 4).

The components C1–C4 have wire rheofores bent downwardly as is shown for the capacitors C4 and C1 respectively in FIGS. 2 and 3.

Figure 4:
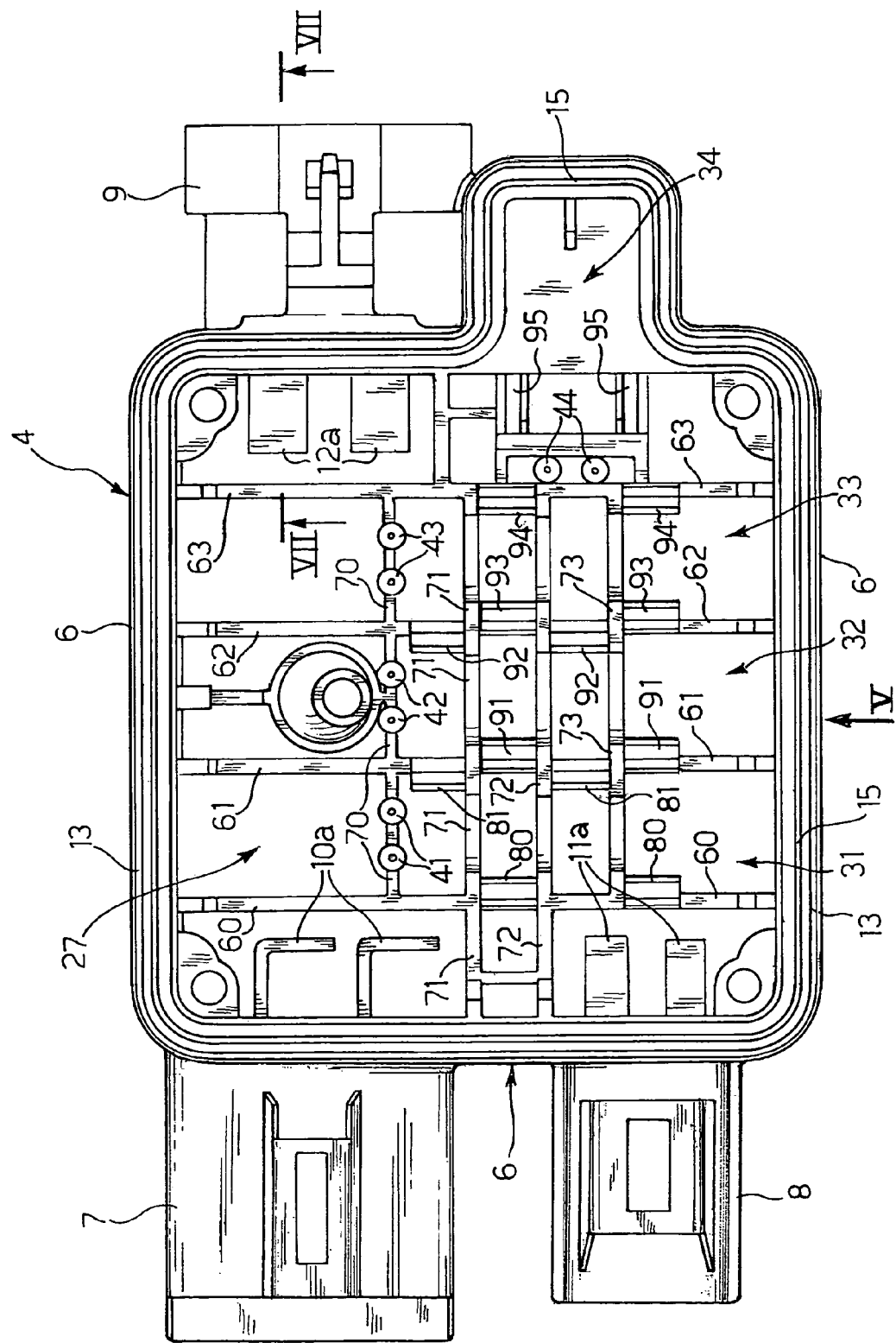
FIG. 4 is a plan view from above of a support included in a unit according to the preceding Figures.

As seen in FIGS. 3 and 4, and in particular in this latter, the support structure 27 for each of the components C1–C4 has a respective pair of eye formations 41-44 into which extend the bent portions of the rheofores of the associated components (see also FIG. 2). These rheofores extend through and beyond corresponding apertures 51–54 (FIG. 3) in the printed circuit board 21 and are soldered to it, for example by means of wave soldering, on its face opposite the support structure 27.

With reference to FIG. 4, the support structure 27 includes a plurality of parallel strips 60–63 orthogonally intersected by a further plurality of strips 70–73 also parallel to one another. The strips 71–73 have respective aligned slots or notches 71a–73a of arcuate profile for receiving the components C1-C3 with form coupling.

The housing 31 for the component C1 is defined between strips 60 and 61. Upwardly from these strips extend respective pairs of resilient projections in the form of retainer blades or tongues 80 and 81 (FIGS. 2–4), preferably slightly convergent towards one another so that the component C1 can be inserted between them with slight interference and then be stably retained between them.

Similar pairs of retainer projections 91 and 92 extend from the strips 61 and 62 on the housing side 32, to retain the component C2.

The resilient retainer tongues associated with the housing 33 for the component C3 have been indicated 93 and 94 in FIGS. 2 and 4, whilst the component C4 is associated with a single pair of counterposed resilient retainer blades indicated 95.

Conveniently, as seen in FIG. 2, from the lower face of the cover 3 extend a plurality of parallel ribs 96 which can interfere with the distal ends of the retainer blades 80–94 described above so as to clamp onto the components C1–C3 which are respectively associated therewith, stabilising the position of these latter. This is particularly convenient for counteracting the effect of vibrations to which the electronic control unit 1 is subjected in use.

The electronic control unit described above can be fabricated in a very easy manner.

The cover 3 and the intermediate support 4 are conveniently formed by means of injection moulding. The terminals 10–12 are conveniently embedded in the intermediate support 4 during the moulding operation.

If the previously described arrangement in which the seals 17 and 18 (FIG. 8) are moulded is adopted, they can be formed directly by means of over-moulding on the support 4, preferably in a single operation and in a single moulding apparatus.

The printed circuit board 21 is conveniently pre-assembled with the associated SMD components.

The heat dissipator 20 is positioned by means of casting or other technique known per se.

Assembly of the electronic unit then proceeds by applying and fixing the printed circuit board 21 to the support 4 by the snap-engagement of the resilient projections 23 of this latter to retain the edges 21b and 21c of the said board.

Once the board 21 is coupled to the support 4 the ends 10a–12a of the connector terminals 10–12 pass through and beyond the corresponding slots 24–26 of the plate 21.

Then mounting of the components C1–C4 takes place, where their rheofores are introduced and guided through the eye formations 41-44 of the support structure 27 within the frame 6 of the intermediate support. These rheofores extend through and beyond the corresponding apertures 51-54 in the printed circuit board 21.

With a single soldering operation, typically by means of wave soldering, the ends 10a–12a of the terminals 10–12 and the rheofores of the components C1–C4 are soldered to the lower face of the printed circuit board 21.

The cover 3, which is welded to the intermediate support 4 by ultrasound, and the heat dissipator 5, can now be coupled to the cover 3. A stable connection of this heat dissipator element to the intermediate support is achievable for example by means of screws.

Conveniently, at least one portion of the lower face of the printed circuit board 21, in particular that corresponding to the transistors M1–M4, is coupled in heat exchange relation with a corresponding surface portion of the heat dissipator element 5 with the interposition of a thermal interface element of heat conductive material such as that indicated 100 in FIGS. 3 and 5. This thermal interface element is of a type known per se, for example of the type called a "gap pad".

The transfer of heat from the transistors M1–M4 to the thermal interface element 100 conveniently takes place by means of the so-called metalised thermal "ways" formed in the printed circuit board 21 during the galvanic growth phase.

Naturally, the principle of the invention remaining the same, the embodiments and details of construction can be widely varied with respect to what has been described and illustrated purely by way of non-limitative example, without by this departing from the ambit of the invention as defined in the annexed claims.

What is claimed is:

1. An electronic control unit in particular a speed control unit for an electric fan, comprising
   a printed circuit board on which is mounted a plurality of electric and electronic components and
   a support of plastics material including a frame which has two opposite perimetral edges from which extends at least one external integral formation in the form of an electric connector element in which are provided electrically conductive connector terminals which have respective ends which extend in part into the frame in a direction essentially orthogonal to the general plane of the frame towards a first perimetral edge of this latter;
   the frame further having a support structure which extends into the frame between the two said perimetral edges;
   first integral retainer formations operable to hold the printed circuit board to the frame on a first side of the said support structure close to the said first perimetral edge of the frame, and
   second integral retainer formations which extend from the said support structure and face away from the said first perimetral edge, or rather towards the second perimetral edge of the frame and which retain at least one independent electronic component provided with wire rheofores, such as a capacitor, on the other side of the support structure; the rheofores of the said at least one independent component and the said ends of the said electrical connection terminals extending towards, through and beyond the said printed circuit board and being soldered to it on the face opposite the said support structure.

2. A control unit according to claim 1, in which the said first perimetral edge of the frame of the support is coupled in a liquid-tight manner to a corresponding edge of a heat dissipator of metal, a surface portion of which is coupled in heat exchange relation to a corresponding surface portion of the said printed circuit board.

3. A control unit according to claim 2, in which between the said surface portions of the heat dissipator element and the printed circuit board is interposed at least one thermal interface element of thermally conductive material.

4. A control unit according to claim 1, in which the said second perimetral edge of the frame of the support is coupled in a liquid-tight sealing manner, preferably by means of ultrasonic welding, to a cover of plastics material.

5. A control unit according to claim 4, in which the cover on the face directed towards the support has raised formations which co-operate with the said second retainer formations by clamping them in engagement with the said at least one component with wire rheofores.

6. A control unit according to claim 2 or 4, in which the said perimetral edges of the frame of the support have respective recesses or grooves in which are disposed respective sealing means co-operating with corresponding edge formations projecting from the cover and from the heat dissipator respectively.

7. A control unit according to claim 6, in which the said sealing means comprise a seal over-moulded onto the support.

8. A control unit according to claim 7, in which each seal has a respective transversely projecting branch which engages in a recess of the corresponding edge formation of the cover and the heat dissipator respectively.

9. A control unit according to claim 1, in which the end portions of the said connector terminals which pan through the printed circuit board have respective half sheared or struck parts which locally increase one dimension of the cross section.

10. A process for the fabrication of an electronic control unit according to claim 1, comprising the operations of:
    forming the said support by injection moulding with pre-shaped connection terminals incorporated in it during moulding;
    forming the printed circuit board with the associated electrical/electronic components;
    coupling the said printed circuit board to the support in such a way that the end of the said connector terminals extend through and beyond the said printed circuit board;
    mounting the said at least one independent component provided with wire rheofores in the support, in such a way that the ends of its rheofores extend through and beyond the said printed circuit board; and
    soldering the ends of the said terminals and the said wire rheofores in a single operation to the printed circuit board.

* * * * *